United States Patent [19]

Fujita

[11] 4,052,645
[45] Oct. 4, 1977

[54] VERTICAL DEFLECTION CIRCUIT

[75] Inventor: Osamu Fujita, Chigasaki, Japan

[73] Assignee: Matsushita Electric Industrial Co., Ltd., Osaka, Japan

[21] Appl. No.: 695,402

[22] Filed: June 14, 1976

[30] Foreign Application Priority Data

| June 20, 1975 | Japan | 50-76064 |
|---|---|---|
| June 20, 1975 | Japan | 50-76065 |
| June 20, 1975 | Japan | 50-76066 |
| June 24, 1975 | Japan | 50-79523 |
| June 24, 1975 | Japan | 50-79524 |
| June 25, 1975 | Japan | 50-79591 |

[51] Int. Cl.² .................. H01J 29/70; H01J 29/72
[52] U.S. Cl. ................... 315/388; 315/397; 315/401
[58] Field of Search ............ 315/397, 399, 401, 408, 315/410, 388

[56] References Cited

U.S. PATENT DOCUMENTS

3,970,894  7/1976  Yasuda et al. .................. 315/399

Primary Examiner—Maynard R. Wilbur
Assistant Examiner—T. M. Blum
Attorney, Agent, or Firm—Stevens, Davis, Miller & Mosher

[57] ABSTRACT

A vertical deflection circuit having a vertical amplifier stage bias voltage stabilizing circuit including a differential amplifier circuit which operates only during the retrace period. One input of the differential amplifier circuit receives a D.C. bias voltage and the other input receives the mean voltage of an output signal. The output of the differential amplifier circuit is fed back to a drive stage to stabilize the bias voltage.

10 Claims, 23 Drawing Figures

VERTICAL DEFLECTION CIRCUIT

The present invention relates to a vertical deflection circuit of a television receiver, and more particularly to an improvement in a vertical amplifier stage bias voltage stabilizing circuit.

Figure 1:
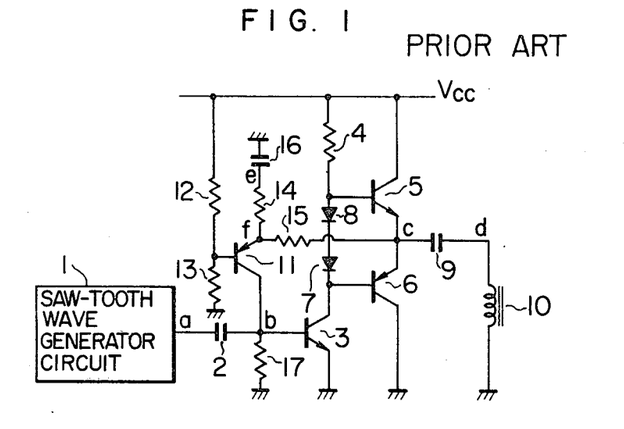
FIG. 1 is an electric wiring diagram of a prior art vertical deflection circuit.

A typical example of a prior art vertical deflection circuit is first explained in conjunction with FIG. 1. In FIG. 1, transistors 3, 5 and 6 constitute a vertical amplifier stage and transistor 11 is a stabilizing transistor.

In FIG. 1, reference numeral 1 designates a saw-tooth wave generator circuit, 2 an input coupling capacitor for a drive transistor 3, 4 a collector load resistor of the drive transistor 3, and 5 and 6 output transistors having their emitters interconnected to form a fully complementary circuit. 7 and 8 denote diodes for compensating for the base-emitter threshold voltages of the output transistors 5 and 6, 9 and output coupling capacitor and 10 a deflection coil. 12 and 13 designate base bias resistors for the transistor 11, and 14, 15 and 16 denote resistors and a capacitor forming a filter circuit for smoothing the output voltage waveform from the output transistors 5 and 6 to produce a mean voltage. 17 designates a resistor inserted between the base of the drive transistor 3 and ground.

The operation of FIG. 1 is now briefly explained.

Figure 2:
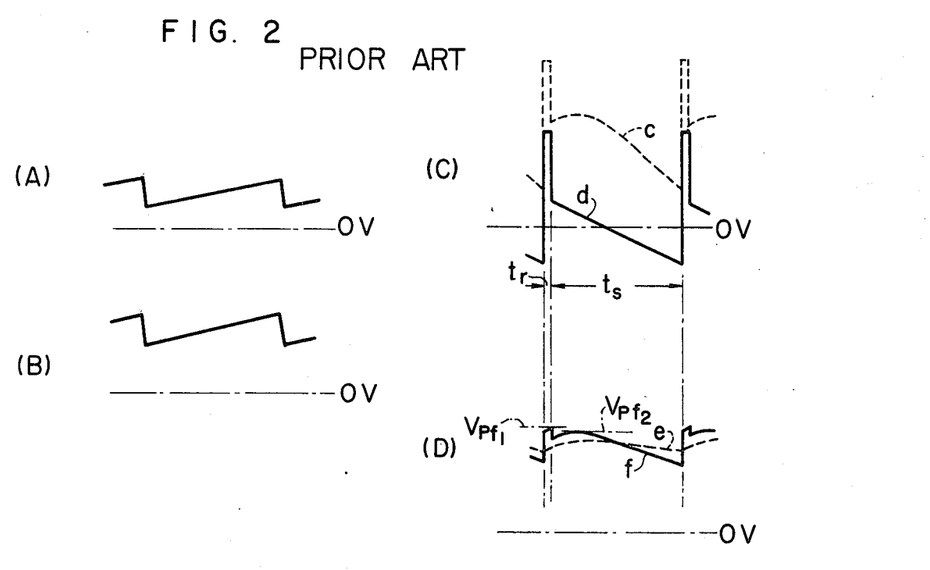

At an output point $a$ of the saw-tooth wave voltage generator circuit 1, a signal of a waveform as shown by (A) in FIG. 2 appears. This signal is passed through the input coupling capacitor 2 to the base (point b) of the drive transistor 3. A waveform as shown by (B) in FIG. 2, which is different from the waveform (A) of FIG. 2 by a D.C. voltage level, appears at the point $b$. This signal is amplified by the drive transistor 3 and a voltage waveform as shown by a dotted line $c$ in FIG. 2, (C) appears at an output point $c$. A voltage waveform as shown by a solid line $d$ in FIG. 2, (C), which is substantially linear during the trace period $t_s$, appears across the deflection coil 10. (Although an inverse S-shaped compensation must be performed depending on the radius of curvature of a cathode ray tube, the voltage waveform is substantially linear as a whole.) A voltage waveform as shown by a dotted line $e$ in FIG. 2, (D) appears at a junction $e$ of the resistor 14 and the capacitor 16, and a voltage waveform as shown by a solid line $f$ in FIG. 2, (D) appears at point $f$.

Those waveforms are now explained.

The dotted line $e$ in FIG. 2,(D) shows the D.C. voltage corresponding to a mean D.C. voltage at the center point $c$ between the output transistors 5 and 6. Depending on the voltage waveform at the point $c$ and the magnitudes of the resistors 14 and 15 and the capacitor 16 which form the smoothing filter circuit, the voltage at the point $e$ usually includes more or less pulsating current although sometimes it may be a complete D.C. waveform. The voltage waveform at the point $e$ and the voltage waveform at the point $c$ are divided by the resistors 14 and 15 to produce a voltage waveform at a point $f$ (waveform $f$ in FIG. 2, (D)), and a pulse peak value $V_{p/1}$ of the voltage waveform at the point $f$ varies with the mean D.C. voltage at the point $c$ which is the center point between the output transistors 5 and 6. The base bias of the transistor 11 is so chosen by the resistors 12 and 13 that the transistor 11 conducts only in response to a pulse signal during the retrace period $t_r$ of the voltage waveform at the point $f$.

Thus, the transistor 11 conducts only during the retrace period $t_r$, and the collector current thereof flows through the resistor 17 and charges the input coupling capacitor 2 to supply a requisite bias voltage to the base of the drive transistor 3. The charge stored in the input coupling capacitor 2 is discharged through the resistor 17 and the drive transistor 3. This discharging current is so small that the voltage across the capacitor 2 is not substantially affected although it slightly decreases with time, and the capacitor is recharged by the next retrace pulse signal. Therefore, the voltage across the input coupling capacitor 2 is maintained at a substantially fixed voltage.

Stabilization of the output terminal of the vertical amplifier stage is as follows:

Assuming that the output terminal bias voltage of the vertical amplifier stage is to rise (that is, the D.C. voltage of the waveform $c$ in FIG. 2, (C) is to rise), the voltage waveform $e$ in FIG. 2, (D), which corresponds to the mean D.C. voltage at the output terminal of the vertical amplifier stage also rises. Accordingly, the pulse peak value $V_{p/1}$ during the retrace period of the voltage waveform at the point $f$ (the voltage waveform $f$ in FIG. 2, (D)) also rises casing transistor 11 to conduct more heavily. Thus, the collector current of transistor 11 increases and the charge current to the input coupling capacitor 2 increases. As a result, the voltage across the input coupling capacitor 2 increases and the base voltage of the drive transistor 3 rises to cause the transistor 3 to operate to lower the voltage at the center point $c$ between the output transistors 5 and 6. As a result, the circuit is balanced at a voltage determined by the base bias to the transistor 11 and the output terminal bias voltage of the vertical amplifier stage is stabilized.

Figure 3:
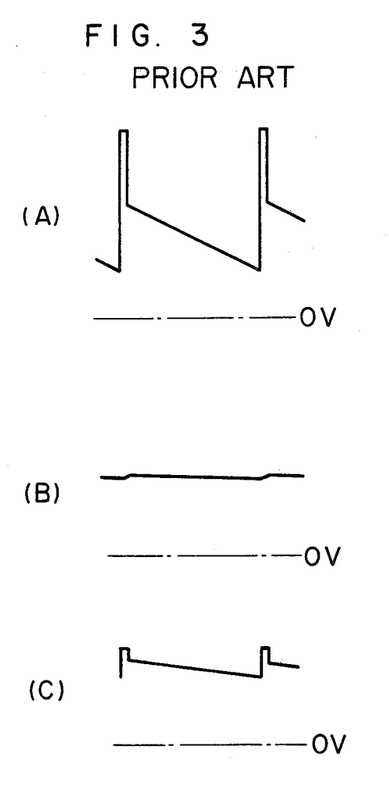

A problem encountered here is the voltage waveform at the point $f$. When the values of the output coupling capacitor 9, the filtering capacitor 16 and the resistors 14 and 15 are chosen sufficiently large, the voltage waveforms at the points $c$, $e$ and $f$ in FIG. 1 are shown in FIG. 3, (A), (B) and (C) and pose no problem for normal operation in steady state. However, at the moment of switch-on, the vertical component of the picture does not momentarily appear because an infinite time period is required to charge the capacitors 9 and 16 to a steady state (in which case a bright horizontal line appears on the screen), or the vertical amplitude of the picture is small immediately after the switch-on and it gradually increases thereafter, or the picture shifts up and down due to the difference in charging time constants for the capacitors.

In order to overcome the above inconvenience, the magnitudes of the output coupling capacitor 9, the filtering capacitor 16 and the resistors 14 and 15 might be reduced to prevent shrinkage or shift of the picture at the moment of the switch-on. However, in this case, the voltage waveforms at the points $c$, $e$ and $f$ include substantial pulsating current as shown in FIG. 4, (A), (B) and (C).

Figure 4:
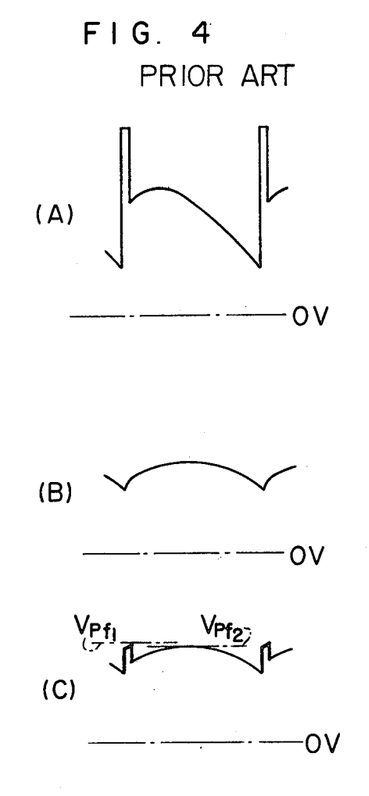

A problem encountered here is the voltage waveform of FIG. 4, (C), in which the values of $V_{p/1}$ and $V_{p/2}$ are too close to each other.

In the present circuit system, transistor 11 essentially operates only during the retrace pulse period and should be cut off during other trace period. If the magnitude of $V_{p/2}$ is too large, transistor 11 may operate in the course of the scan period to vary the base bias of the drive transistor 3. This results in an inconvenience in that a linearity of the picture is deteriorated. Furthermore, even if $V_{p/2}$ is little lower than $V_{p/1}$ at the room temperature and the transistor 11 is prevented from operating at $V_{p/2}$, the base bias of the transistor 11 may change with the change of ambient temperature and the change of power supply voltage to the extent that the transistor 11 is operated at $V_{p/2}$. This results in deterioration of the linearity of the image.

It is, therefore, a first object of the present invention to provide a vertical deflection circuit which does not cause a shift of the picture at the moment of switch-on and does not cause a phenomenon in which a vertical component of the picture does not appear at the moment of switch-on.

It is a second object of the present invention to provide a vertical deflection circuit which does not cause deterioration of the linearity of the picture as a result of a change in ambient temperature and variation in power supply voltage and assures a high quality of image display.

It is a third object of the present invention to provide a vertical deflection circuit which is inexpensive and easily constructed as an IC structure.

It is a fourth object of the present invention to provide a vertical deflection circuit which assures a high quality of image display when a switch is turned on immediately after it has been turned off.

The above and other objects, features and advantages of the present invention will become more apparent from the following description of the preferred embodiments of the invention when taken in conjunction with the accompanying drawings, in which:

FIGS. 2(A), (B), (C) and (D) show voltage waveforms for explaining the operation of the circuit of FIG. 1.

FIGS. 3(A), (B) and (C) and FIGS. 4(A), (B) and (C) show voltage waveforms for explaining the operation of the circuit of FIG. 1.

FIG. 8(A), (B) and (C) show voltage waveforms for explaining the operation of the circuit of FIG. 7.

Figure 5:
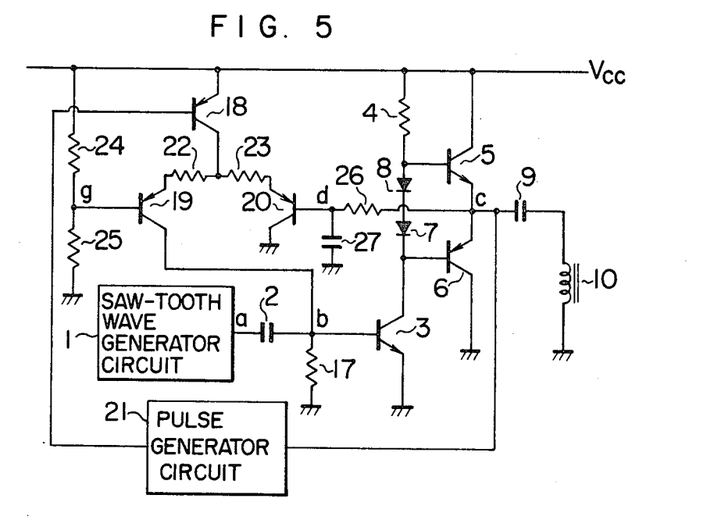
FIG. 5 is an electrical wiring diagram of a vertical deflection circuit in accordance with one embodiment of the present invention.

A first embodiment of the present invention is shown in FIG. 5, in which the same circuit components as those in FIG. 1 bear like numerals.

Referring to FIG. 5, in the present embodiment, transistors 18, 19 and 20 constitute a vertical amplifier stage bias voltage stabilizing circuit which corresponds to the circuit of the transistor 11 in FIG. 1. The transistor 18 also functions as a constant current circuit for the transistors 19 and 20 which form a differential amplifier circuit. The transistor 18 has its base connected to an output terminal of a pulse generator circuit 21, and it is pulse controlled by the output of the pulse generator circuit 21 so that it is operated only during a retrace period and rendered non-conductive during the scan period. The pulse generator circuit 21 has its input terminal connected to the output terminal c of the output transistors 5 and 6. Emitter resistors 22 and 23 for the transistors 19 and 20 are inserted in order to improve the balance of the transistors. The resistors 22 and 23 may be omitted. Base biasing resistors 24 and 25 for the transistor 19 indirectly determine a mean voltage at the output terminal c of the output transistors 5 and 6. The transistor 18 has its base connected to the output terminal of the pulse generator circuit 21 and has its collector connected to the junction of the emitter resistors 22 and 23. A resistor 26 and a capacitor 27 serve to smooth the voltage at the junction of the output transistors 5 and 6. One end of the resistor 26 is connected to the junction c of the output transistors 5 and 6. The transistor 20 has its base connected to the junction of the resistor 26 and the capacitor 27. On the other hand, the transistor 19 has its collector connected to the base of the drive transistor 3.

The operation of the circuit of FIG. 5 is now briefly explained.

Assuming that the potential at the junction c of the output transistors 5 and 6 is to rise, the mean voltage at the center point c rises so that the transistors 19 and 20 of the differential amplifier circuit are operated such that one of the transistors, 19, tends to increase its collector current. The operation hereafter is the same as that in FIG. 1 and hence not described here. In this manner, the mean voltage level at the junction c of the output transistors 5 and 6 is stabilized at the voltage determined by the resistors 24 and 25.

It should be noted here that the vertical amplifier stage bias voltage stabilizing circuit comprising the transistors 18, 19 and 20 operates only during the retrace period. Whatever pulsating current the waveform at the point d may include, the constant current circuit and the differential amplifier circuit are completely blocked during the scan period so that the inconvenience encountered in the prior art, that is, the deterioration of the linearity, is avoided. Furthermore, the magnitudes of the capacitors 9 and 27 and the resistor 26 may be chosen to any desired values without causing a shift of the picture at the time of switch-on and the disappearance of the vertical component of the picture at the time of switch-on. In addition, there is no influence on the linearity of the picture by the change of ambient temperature and the variation in the magnitudes of the components.

Figure 6:
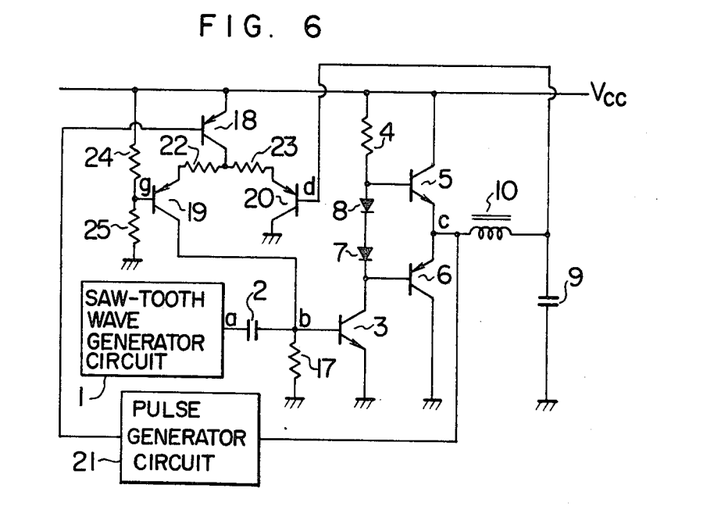
FIG. 6 is an electrical wiring diagram illustrating an improved embodiment of the vertical deflection circuit of FIG. 5.

FIG. 6 shows an improved circuit over the circuit of FIG. 5. In FIG. 6, the same components as those in FIG. 5 bear like reference numerals. A difference between FIGS. 5 and 6 resides in manner of obtaining the mean voltage value at the junction of the output transistors 5 and 6. In FIG. 5, the resistor 26 and the capacitor 27 smooth the voltage waveform at the junction c of the output transistors 5 and 6 by the filter circuit. On the other hand, in FIG. 6 the arrangement of the deflection coil 10 and the output coupling capacitor 9 is opposite to that in FIG. 5. That is, one end of the deflection coil is directly connected to the point c and the capacitor 9 is connected between the other end of the deflection coil 10 and ground, and the voltage across the output coupling capacitor 9 developing at the junction of the output coupling capacitor 9 and the deflection coil 10 is used as the input signal to the transistor 20 in the vertical amplifier stage bias voltage stabilizing circuit. When the capacitance of the capacitor 9 is sufficiently large, the voltage across the output coupling capacitor 9 is substantially free from a pulsating component as shown in FIG. 3, (B), which appears as the mean voltage at the output stage toward the vertical amplifier. When the capacitance of the coupling capacitor 9 is reduced to a minimum required value, the mean voltage appearing at the output stage toward the vertical amplifier includes a relatively large pulsating component as shown in FIG. 4, (B). It is apparent that when this signal is used as the input signal to the vertical amplifier stage bias voltage stabilizing circuit the same operation as in FIG. 5 is attained, although the magnitudes of the resistors 24 and 25 should be changed in this case to alter the bias voltage of the transistor 19.

As is apparent from the comparison with FIG. 5, the circuit of FIG. 6 is less expensive because the filtering resistor 26 and capacitor 27 can be eliminated. When the circuit is constructed as an IC structure, the advantage of the elimination of the capacitor 27 is significant because the capacitor is an off-chip component. Furthermore, when compared with FIG. 5, the circuit of FIG. 6 requires a shorter time before it reaches a stable state after the switch-on. The reason is as follows: in FIG. 5, when a given time period determined by a time constant of the resistor 26 and the capacitor 27 has elapsed after the output coupling capacitor 9 was charged and the voltage at the point c rose to a normal operating voltage, the potential at the point d becomes the mean D.C. voltage at the junction of the output transistors 5 and 6. On the other hand, in FIG. 6, since the mean D.C. voltage at the center point of the output transistors 5 and 6 is taken from the voltage across the output coupling capacitor 9, there is no time delay by the resistor 26 and the capacitor 27, which is included in the circuit of FIG. 5.

Thus, the embodiment of FIG. 6 can attain a similar effect to that in FIG. 5 and yet it provide an advantage in that the circuit assumes a stable operating condition immediately after the switch-on.

Let us now consider the transient of the circuit of FIG. 6 at the time of switch-on. Since the same consideration is applicable to FIG. 5, FIG. 6 is considered as representative.

At the time of the switch-on, the voltage at the base of the transistor 19, the point g, rises at a gradient of the rise of the power supply $V_{cc}$ proportioned by the resistors 24 and 25. On the other hand, the base voltage of the transistor 20 rises in relation to the charging time constant of the output coupling capacitor 9, and as the capacitance of the output coupling capacitor 9 increases the base voltage of the transistor 20 rises more slowly. Therefore, if the constant current source transistor 18 operates normally from the moment of the switch-on, the transistor 20 is turned on while the transistor 19 is turned off after the switch-on since the base voltage of the transistor 20 is lower than the base voltage of the transistor 19. At this time, if the D.C. voltage level at the output of the saw-tooth wave generator circuit 1, i.e., at the point a is low, the drive transistor 3 and one of the output transistors 6, are turned off and no output signal appears at the output point c. On the other hand, since the other output transistor 5 is an emitter follower coupled to the output coupling capacitor 9 to cause the charging current to flow through the deflection coil 10, the voltlage across the output coupling capacitor gradually rises, and as this voltage rises an output waveform gradually appears at the output point c. When the output coupling capacitor 9 is fully charged, normal operation begins. Accordingly, during this transient action a predetermined voltage waveform does not appear at the output, but a D.C. waveform appears immediately after the switch-on and thereafter a saw-tooth output waveform (including retrace pulse) which gradually increases in amplitude appears. Therefore, in this case, the picture immediately after the switch-on does not represent a vertical component and the vertical amplitude gradually increases thereafter. Such a display condition is not desirable.

Figure 7:
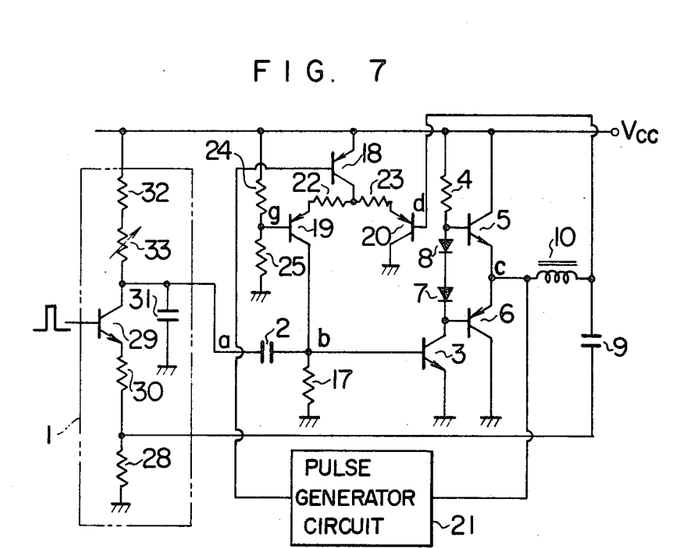
FIG. 7 is an electrical wiring diagram illustrating a further improvment of the vertical deflection circuit of FIG. 6.

The circuit of FIG. 7 eliminates the above inconvenience. The characteristic of this circuit resides in the saw-tooth wave generating circuit 1, in which the voltage across the input coupling capacitor 2 at the steady state is selected to a small value, e.g., around 0 to 0.2 V. With this arrangement, a satisfactory operation is achieved as described below. Immediately after the switch-on, the voltage across the input coupling capacitor 2 has been discharged and hence at "zero" level. On the other hand, since the transistor 19 is cut off at this time, the base bias voltage of the drive transistor 3 is the same as the D.C. potential at the point a. Since the D.C. voltage at the point a has been at or near a normal operation voltage for the drive transistor 3, the drive transistor 3 starts to operate even immediately after the switch-on.

Accordingly, the output transistors 5 and 6 also starts to operate. In the circuit of FIG. 7, therefore, there is no possibility of the disappearance or contraction of the vertical component of the picture at the moment of the switch-on. Even if they occur, the degree of the phenomenon is smaller and the period is shorter than in the case of FIGS. 5 and 6, and the image having a normal vertical amplitude appears substantially momentarily.

The construction and the operation of FIG. 7 are now explained. In the present embodiment, a resistor 28 is connected in series with the output coupling capacitor 29, and the voltage waveform across the resistor 28 is applied to the emitter of the switching transistor 29 to control the D.C. level of the saw-tooth wave appearing at the collector of the switching transistor 29. The emitter resistor 30 for the switching transistor 29 may be omitted. 31 designates a saw-tooth wave voltage generating capacitor, and 32 and 33 denote a resistor and a variable resistor for charging the capacitor 31.

Figure 8:
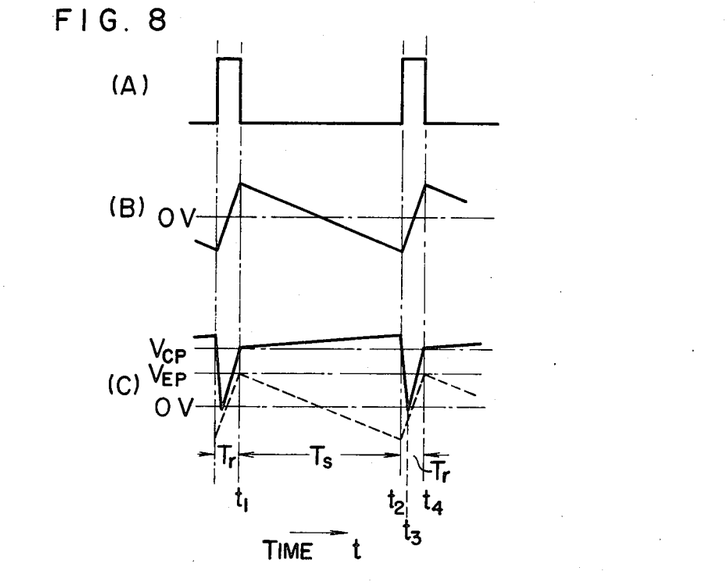

The operation of FIG. 7 is further explained in conjunction with FIG. 8. A pulse signal having a pulse duration corresponding to a retrace period $T_r$, as shown in FIG. 8, (A) is applied to the base of the switching transistor 29. (In actual fact, the superposition of a trigger pulse by a synchronous signal to a retrace period pulse at the output stage is applied.) During the cut-off of the switching transistor 29 (i.e., during the scan period $T_s, t_1$ to $t_2$), a charging current flows from the power supply through the resistor 32 and the variable resistor 33 into the capacitor 31. Thus, the capacitor is charged and a waveform having a gentle positive gradient as shown by the solid line in FIG. 8, (C) during the period $t_1$ to $t_2$, appears across the capacitor 31. When the time t reaches $t_2$, the switching transistor 29 conducts to rapidly discharge the charge stored in the capacitor 31. Since the waveform as shown in FIG. 8, (B) or by the dotted line in FIG. 8, (C) which appears across the resistor 28 is applied to the emitter of the switching transistor 29, the voltage waveform which is the superposition of the emitter waveform (FIG. 8 (B)) and the voltage waveform caused by the discharging current appears at the collector of the switching transistor 29 during the period $t_2 - t_4$, so that the waveform as shown by the solid line in FIG. 8, (C) is produced. That is, during the period $t_2 - t_3$, the emitter voltage of the switching transistor is low and the waveform rapidly falls. Then, during the period $t_3 - t_4$, it is raised by the waveform of the emitter voltage of the switching transistor. At the time $t_4$, the switching transistor 29 is again cut-off and the charging current again flows through the resistor 32 and the variable resistor 33 into the capacitor 31 to charge the same. In this manner the operation is repeated from the time $t_1$.

What should be noted here is $V_{cp}$ and $V_{Ep}$ in FIG. 8, (C). $V_{Ep}$ represents a peak value of the voltage waveform appearing at the emitter of the switching transistor 29, and $V_{cp}$ represent the voltage at the start of scan of the voltage waveform at the collector of the switching transistor 29. The difference between $V_{cp}$ and $V_{Ep}$ is a collector-emitter saturation voltage $V_{CE}$ (sat) of the switching transistor 29, which is substantially constant. Accordingly, the magnitude of $V_{cp}$ depends on $V_{Ep}$. The magnitude of $V_{Ep}$ is determined by the current flowing through the deflection coil and the magnitude of the resistor 28. The current flowing through the deflection coil 10 is determined when the cathode ray tube, the high voltage and the deflection coil are specified. Therefore, $V_{cp}$ can be changed by changing the magnitude of the resistor 28. In this manner, the D.C. level of the saw-tooth wave at the point $a$ which is the output of the saw-tooth wave generator circuit 1 can be changed.

By employing the circuit of FIG. 7, it is possible to set the voltage across the input coupling capacitor 2 to around 0 to 0.2 V at steady state by properly adjusting the resistance of the resistor 28. As a result, the picture can appear instantly at the time of the switch-on and a good imaging characteristic is assured. Although the voltage at the point $d$ is the superposition of the voltage waveform across the output coupling capacitor 9 and the voltage waveform across the resistor 28 (FIG. 8, (B)), the amplitude of the voltage waveform across the resistor 28 is so small that the pulsating component in the voltage waveform at the point $d$ increases only very slightly, which can be neglected.

Figure 9:
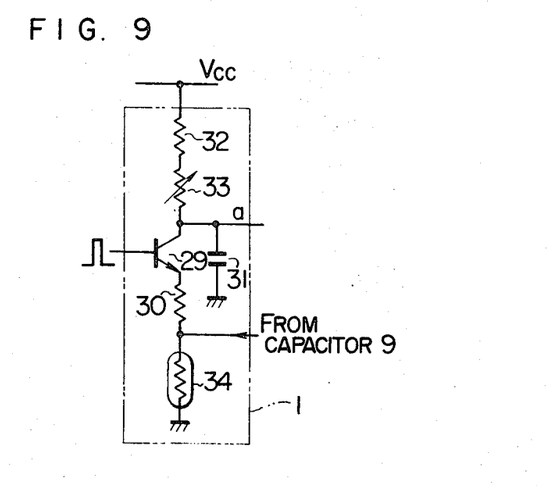
FIG. 9 is an electrical wiring diagram of a major part of a further improvement of the vertical deflection circuit of FIG. 7.

FIG. 9 shows a further improved circuit over the circuit of FIG. 7, which further improves the appearance of the picture after the switch-on for the change of ambient temperature. Although only the saw-tooth wave generator circuit 1 is shown in FIG. 9, the remaining portions of the circuit are identical to the corresponding portions in FIG. 7 and hence they are not explained here.

The difference from FIG. 7 lies in that a temperature sensitive resistor element 34 is connected in place of the resistor 28 in FIG. 7. As the ambient temperature changes, the resistance of the temperature sensitive resistor element 34 changes so that the D.C. voltage level of the saw-tooth wave voltage appearing at the point $a$ changes.

The base-emitter forward voltage of the drive transistor 3 also changes with the ambient temperature. Thus, by setting the resistance of the temperature sensitive resistor element 34 to match with the change of the base-emitter forward voltage $V_{BE3}$ of the drive transistor 3 by the change of temperature, the change in the voltage across the input coupling capacitor 2 by the change of ambient temperature can be reduced to substantially zero so that a good imaging characteristic at the time of the switch-on is assured over entirer operating temperature range.

In practice, since the base-emitter forward voltage of the transistor decreases as the ambient temperature rises, a thermistor may be used as the temperature sensitive resistor element 34 so that the amplitude of the voltage waveform across the temperature sensitive resistor element 34 decreases as the ambient temperature rises, and the D.C. voltage level of the saw-tooth wave appearing at the point $a$ decreases.

While the circuit of FIG. 9 uses only one temperature sensitive resistance element 34, a series connection of the temperature sensitive resistance element and a conventional resistor, or parallel connection thereof or even the combination of the series and parallel connections may be used in order to obtain a proper compensation characteristic. Thus, with the arrangement of FIG. 9, a stable imaging characteristic at the time of the switch-on is assured even when variation of ambient temperature is included. Furthermore, in accordance with the present embodiment, the degree of contraction of the vertical component of the image by the rise of the ambient temperature can be reduced. The reason is as follows; since a constant voltage output scheme is used, the voltage waveform at the point $c$ is constant, but the current flowing through the deflection coil 10 decreases because the loss of the winding thereof increases as the ambient temperature rises. On the other hand, the resistance of the temperature sensitive resistance element 34 (thermistor) connected in series with the deflection coil 10 decreases to compensate for the decrease in the current flowing through the deflection coil 10. Thus, the circuit of FIG. 9 provides additional advantage of reducing the degree of vertical contraction of the picture.

When the circuit is switched on after a while of the switch-off, the imaging characteristic at the time of the switch-on in the circuits of FIGS. 7 and 9 is good. However, when the circuit is switched on immediately after the switch-off, the vertical component of the picture may not appear for a while or the vertical component may contract by the reason described below.

Such phenomena occur because the falling characteristics of the base voltages of the transistors 19 and 20 forming the differential amplifier circuit at the time of the switch-off differ from each other. At the time of the switch-off, the voltage at the base of the transistor 19, at the point $g$, falls proportionally to the falling gradient of the power supply voltage $V_{cc}$. On the other hand, the voltage at the base of the other transistor 20, at the point $d$, falls more slowly than the fall at the point $g$ because the falling gradient of the discharge of the output coupling capacitor 9 is more gentle than the falling gradient at the point $g$. Therefore, at the time of the switch-off, the voltage at the base of the transistor 20 is always higher than the voltage at the base of the transistor 19. Thus, the transistor 20 is biased toward cut-off while the transistor 19 is biased toward conduction so that much collector current flow through the transistor 19 and the input coupling capacitor 2 is overchanged by the collector current. If the circuit is switched on after the overcharged capacitor has been sufficiently discharged, a good imaging characteristic would be obtained. However, if the circuit is switched on before the overcharged input coupling capacitor 2 has been discharged, the base voltage of the drive transistor 3 would be biased more heavily toward the conduction because the voltage across the input coupling capacitor 2 is higher than the steady state voltage. Thus, the voltage at the point c of the output transistors 5 and 6 is pulled to the ground. As a result, the output voltage waveform approaches the ground potential or has its ground side contracted so that the vertical component of the picture does not appear or lower portion of the picture contracts.

Figure 10:
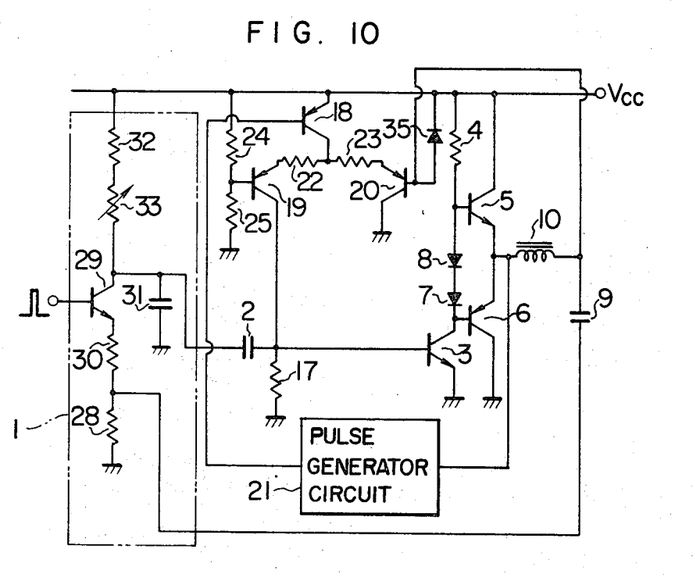
FIG. 10 is an electrical wiring diagram of a further improvement of the vertical deflection circuit of FIG. 7.

The circuit of FIG. 10 overcomes the above inconvenience. This circuit differs from that of FIG. 7 in that a diode 35 is connected between the base of one of the transistors 20, forming the differential amplifier circuit and the power line, in with such a polarity that it is cut-off during the normal operating state.

The present circuit is effective only when the fall of the power supply voltage $V_{cc}$ at the time of the switch-off is steeper than the fall of the voltage across the output coupling capacitor 9. At the time of the switch-off, by turning on the diode 35 such that the voltage across the output coupling capacitor which would otherwise fall slowly is forcibly matched to the steep falling characteristic of the power supply voltage, the output coupling capacitor 9 is rapidly discharged. As a result, the transient current flowing through the transistor 19 can be reduced to prevent overcharge of the input coupling capacitor 2. Consequently, even if the circuit is switched on immediately after the switch-ff, the degree of the disappearance of the vertical component of the picture or the contraction of the lower portion of the picture can be substantially reduced and a substantially satisfactory imaging characteristic is obtained.

Figure 11:
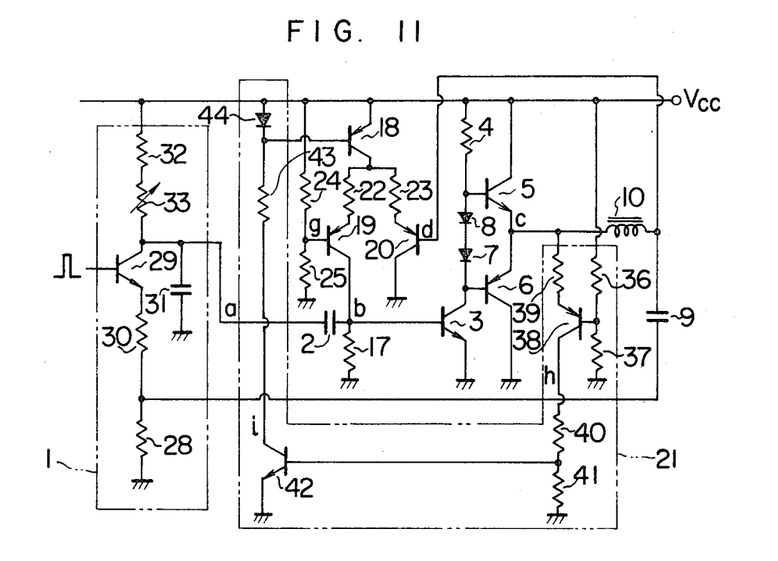
FIG. 11 is an electrical wiring diagram of a further improvement of the vertical deflection circuits of FIG. 7 and FIG. 10.

The circuit of FIG. 11 further overcomes the inconveniences encounted in the circuits of FIGS. 7 and 10 and provides better characteristic than the circuit of FIG. 10. In the present embodiment, a pulse generator circuit 21 for driving the constant current circuit is actuated such that the operation of the vertical amplifier stage bias voltage stabilizing circuit is blocked when the power supply voltage falls below a given voltage for preventing the extra collector current from flowing through the transistor 19 at the time of switch-off. With this arrangement at time of the switch-off, the input coupling capacitor 2 is not overcharged by the extra collector current and hence a good imaging characteristic is assured even if the circuit is switched on soon after the switch-ff. Furthermore, the requirement that the fall of the power supply voltage at the time of the switch-off should be steeper than the fall of the voltage across the capacitor 9 as required in FIG. 10 is no longer necessary. The circuit of FIG. 11 is characterized by the pulse generator circuit 21 and the remaining portions are exactly the same as those of FIG. 7.

Figure 12:
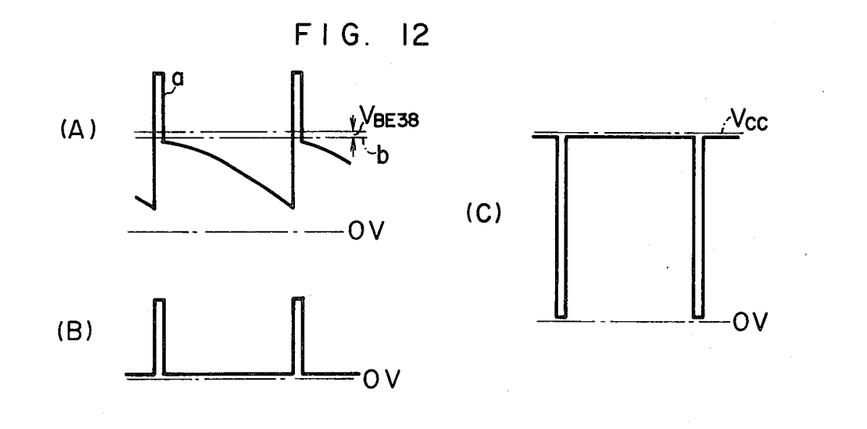
FIG. 12 shows voltage waveforms for explaining the operation of the circuit of FIG. 11.

FIG. 12 shows voltage waveforms at various points in FIG. 11, mainly of the pulse genrator circuit 21. FIG. 12(A) shows at a a voltage waveform at the output point c, and the resistors 36 and 37 are so chosen that the voltage at the junction of the resistors is given by b in FIG. 12(A). The transistor 38 has its emitter connected to the point c through the resistor 39 an has its base connected to the junction of the resistors 36 and 37. Thus, the transistor 38 conducts at a voltage level which is higher than the sum of the voltage level b of the voltage waveform of FIG. 12(A) and the base-emitter threshold voltage $V_{BE38}$ of the transistor 38, and it is cut-off during the other period. That is, the transistor 38 conducts only during the retrace period and it is cut-off during the scan period, thus producing a pulse voltage as shown in FIG. 12(B) at the point h or at the collector of the transistor 38. The pulse voltage at the point h is divided by the resistors 40 and 41, and the divided pulse signal is applied to the base of the transistor 42 where it is amplified and inverted resulting in a pulse voltage waveform as shown in FIG. 12(C) at the point i or at the collector terminal. This pulse voltage waveform is then applied to a series circuit of the resistor 43 and the diode 44. A forward voltage of the diode 44 is set to be equal to a base-emitter forward voltage of the transistor 18. Consequently, the collector current of the transistor 18 is equal to the current flowing through the diode 44, and the transistor 18 operates as a constant current source circuit.

By properly choosing the ratio of the resistors 40 and 41 such that when the power supply voltage $V_{cc}$ reaches a predetermined magnitude, i.e. 70% of its rating, the amplitude of the pulse appearing across the resistor 41 becomes equal to the base-emitter threshold voltage of the transistor 42, the transistor 42 is rendered cut-off when the power supply voltage $V_{cc}$ falls below 70% of the rating. Thus, the constant current source transistor 18 is also cut-off and the operation of the vertical amplifier stage bias voltage stabilizing circuit is stopped.

With the above circuit configuration, when the circuit is switched off and the power supply voltage falls below the given voltage, e.g. 70% of the rating as stated above, the operation of the vertical stage bias voltage stabilizing circuit is blocked. Therefore, the flow of extra collector current of the transistor 19 at the time of the switch-off can be prevented and the input coupling capacitor 2 is not overcharged. Although the extra collector current flows through the transistor 19 until the power supply voltage falls from the rated voltage to 70% of the rating and the input coupling capacitor 2 is charged during that period, the amount of charge is small and the charge is discharged through the discharging resistor 17. Therefore, even if the circuit is switched on soon after the switch-off, the input coupling capacitor 2 has not been overcharged and there is no possibility of the disappearance of the vertical component of the picture or the contract of the vertical component at the moment of the switch-on and hence a good imaging characteristic is obtained.

Figure 13:
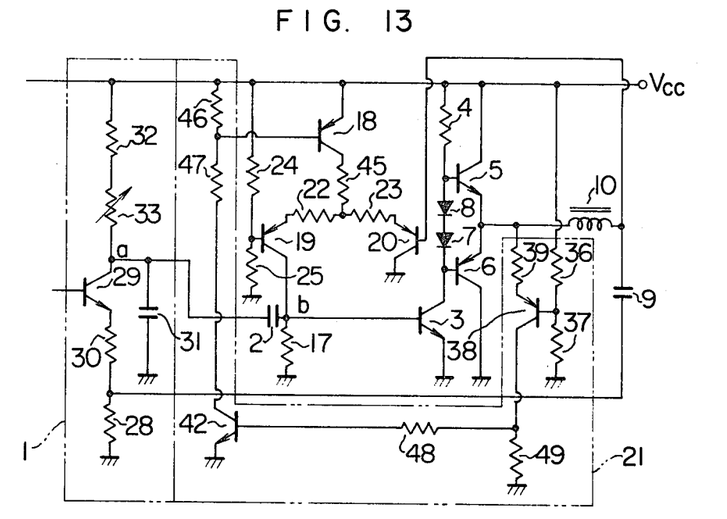
FIG. 13 is an electrical wiring diagram of another embodiment of the vertical deflection circuit of the present invention.

A further embodiment which can provide the same effect as the circuit of FIG. 11 is shown in FIG. 13. The basic circuit construction thereof is the same as that of FIG. 11 but it differs in that the transistor 18 is used as a complete switching device operated in either saturation or cut-off. The circuit configuration is a constant current source circuit in which a resistor 45 is connected to a collector of the transistor 18. The transistors 38 and 42 operate in substantially the same manner as in FIG. 11 except that the transistor 42 operates even if the power supply voltage falls to supply the pulse voltage to the series circuit of the resistors 46 and 47. By properly selecting the resistances of the resistors 46 and 47, the transistor 18 can be saturated at the rated power supply voltage and the voltage across the resistor 46 is kept below the base-emitter threshold voltage of the transistor 18 when the power supply voltage falls to a given voltage (e.g., around 70% of the rating), to cut-off the transistor 18 so that the vertical amplifier stage bias voltage stabilizing circuit is blocked. In this manner, the same effect as in the case of FIG. 11 can be provided and the imaging characteristic at the time of the switch-off is improved. The reference numerals 48 and 49 designate resistors.

Figure 14:
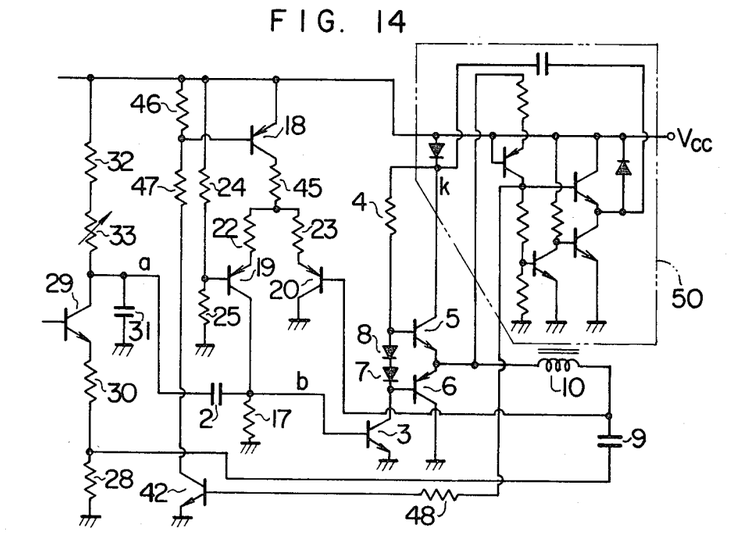
FIG. 14 is an electrical wiring diagram of a further embodiment of the vertical deflection circuit of the present invention.

In the above circuits, the power supply to the output stage is common to the other circuits such as the saw-tooth wave voltage generator circuit and the vertical amplifier stage bias voltage stabilizing circuit. However, the vertical amplifier stage bias voltage stabilizing circuit of the present invention is equally effective in the circuit of FIG. 14 in which the power supply voltage for the drive stage and the vertical amplifier stage is raised only during the retrace period (to about the double of the power supply voltage). The block 50 in FIG. 14 shows a circuit for raising the voltage at the point $k$ to about 2 $V_{cc}$ only during the retrace period by the retrace period. This circuit has been well known and hence the explanation thereof is omitted here.

What is claimed is:

1. A vertical deflection circuit comprising a saw-tooth wave voltage generator circuit, a drive stage coupled to the output terminal of said saw-tooth wave voltage generator circuit through an input coupling capacitor, a vertical amplifier stage directly coupled to said drive stage, and a vertical amplifier stage bias voltage stabilizing circuit including a differential amplifier circuit fed by a constant current source having a constant current circuit which operates only during a retrace period, a first input terminal of said differential amplifier circuit and a second input terminal of said differential amplifier circuit being connected to an output terminal of a circuit producing a mean voltage at the output terminal of said vertical amplifier stage, an first output terminal of said differential amplifier circuit being connected to the junction of said input coupling capacitor and the input terminal of said drive stage.

2. A vertical deflection circuit according to claim 1, wherein a filtering circuit including a resistor and a capacitor is connected to said output terminal of the vertical amplifier stage and the second input terminal of said differential amplifier circuit is connected to an output terminal of said filtering circuit.

3. A vertical deflection circuit according to claim 1, wherein an output coupling capacitor is connected to said output terminal of the vertical amplifier stage through a deflection coil, and the second input terminal of said differential amplifier circuit is connected to the junction of said deflection coil and said output coupling capacitor.

4. A vertical deflection circuit according to claim 1, wherein an input terminal of a pulse generator circuit is connected to said output terminal of the vertical amplifier stage and an output terminal of said pulse generator circuit is connected to a base of a transistor forming the constant current source.

5. A vertical deflection circuit according to claim 4 wherein said pulse generator circuit includes a first transistor which conducts only during the duration of a retrace pulse and is cut-off during a scan period and a second transistor for amplifying the output of said first transistor, the output of said second transistor being applied to the base of a transistor forming said constant current circuit such that when a power supply voltage falls below a given voltage the peak value of a pulse signal applied to said seond transistor falls below a threshold voltage of said second transistor, whereby said second transistor is cutt-off to cut-off the transistor of said constant current source circuit.

6. A vertical deflection circuit according to claim 4 wherein said constant current circuit includes a switching transistor having a pulse signal of a pulse width corresponding to said retrace period applied to its base and having its collector connected in series with a resistor, the other end of said resistor being connected to said differential amplifier circuit such that when a power supply voltage falls below a given voltage a peak value of an input pulse signal to a base of said switching transistor falls below a threshold voltage of said switching transistor whereby the switching transistor is cut-off.

7. A vertical deflection circuit according to claim 1, wherein said saw-tooth wave voltage generator circuit includes a switching transistor having a vertical synchronizing trigger pulse applied to its base and having a charge-discharge circuit for generating a saw-tooth voltage connected to its collector, the collector of said switching transistor being connected to the input coupling capacitor, a series circuit of a deflection coil and a capacitor having its one terminal connected to the output terminal of the vertical amplifier stage and having its other terminal grounded through an impedance circuit, and the emitter of said switching transistor circuit being connected to a non-grounded terminal of said impedance circuit.

8. A vertical deflection circuit according to claim 7 wherein said impedance circuit includes a temperature sensitive element.

9. A vertical deflection circuit according to claim 1 wherein said differential amplifier circuit include a unidirectional element poled to be cut-off during normal operation, inserted between the second input terminal of said differential amplifier circuit and a power supply line.

10. A vertical deflection circuit according to claim 1 wherein said constant current circuit which serves as the constant current source for said differential amplifier circuit stops its operation when the power supply voltage falls below a given voltage whereby the operation of said vertical amplifier stage center point bias voltage stabilizing circuit is stopped.

* * * * *

UNITED STATES PATENT AND TRADEMARK OFFICE
CERTIFICATE OF CORRECTION

PATENT NO. : 4,052,645
DATED : October 4, 1977
INVENTOR(S) : Osamu Fujita

It is certified that error appears in the above-identified patent and that said Letters Patent are hereby corrected as shown below:

On the title sheet, add the following foreign application to the Foreign Application Priority Data --June 25, 1975   Japan   50-79592--

Signed and Sealed this

*Eleventh* Day of *April 1978*

[SEAL]

Attest:

RUTH C. MASON
*Attesting Officer*

LUTRELLE F. PARKER
*Acting Commissioner of Patents and Trademarks*